United States Patent
Jang

(10) Patent No.: US 7,679,177 B2
(45) Date of Patent: Mar. 16, 2010

(54) INTEGRATED CIRCUIT PACKAGING SYSTEM WITH PASSIVE COMPONENTS

(75) Inventor: Ki Youn Jang, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 215 days.

(21) Appl. No.: 11/859,462

(22) Filed: Sep. 21, 2007

(65) Prior Publication Data

US 2009/0079066 A1    Mar. 26, 2009

(51) Int. Cl.
*H01L 23/02* (2006.01)

(52) U.S. Cl. ............... 257/686; 257/E25.027; 257/685; 257/724; 257/777; 438/108; 438/109

(58) Field of Classification Search .......... 257/E21.505, 257/E25.001, 724, 685, 777, 686, 723, 730, 257/728, 778, 528, 532, 355, 357, 736, E25.027; 438/107–109; 361/760
See application file for complete search history.

(56) References Cited

U.S. PATENT DOCUMENTS

| | | | | |
|---|---|---|---|---|
| 5,399,898 A | * | 3/1995 | Rostoker | ............ 257/499 |
| 5,864,177 A | * | 1/1999 | Sundstrom | ............ 257/723 |
| 6,239,366 B1 | * | 5/2001 | Hsuan et al. | ............ 174/529 |
| 6,611,434 B1 | * | 8/2003 | Lo et al. | ............ 361/760 |
| 6,627,507 B2 | | 9/2003 | Yuan | |
| 6,700,794 B2 | * | 3/2004 | Vinson et al. | ............ 361/782 |
| 6,853,063 B2 | * | 2/2005 | Akiyama et al. | ............ 257/685 |
| 6,873,035 B2 | * | 3/2005 | Watanabe et al. | ............ 257/686 |
| 6,873,036 B2 | * | 3/2005 | Akram | ............ 257/686 |
| 6,921,975 B2 | * | 7/2005 | Leal et al. | ............ 257/723 |
| 6,946,601 B1 | | 9/2005 | Lee et al. | |
| 7,105,923 B2 | | 9/2006 | Lyne | |
| 7,262,494 B2 | * | 8/2007 | Shiu et al. | ............ 257/686 |
| 7,309,913 B2 | * | 12/2007 | Shim et al. | ............ 257/686 |
| 2007/0138603 A1 | | 6/2007 | Lam | |
| 2007/0145662 A1 | | 6/2007 | Yamada | |

\* cited by examiner

*Primary Examiner*—Chris C Chu
(74) *Attorney, Agent, or Firm*—Mikio Ishimaru

(57) ABSTRACT

An integrated circuit packaging system comprising: fabricating a system-in-package substrate; mounting a first integrated circuit die on the system-in-package substrate; mounting a second integrated circuit die on the system-in-package substrate; and coupling a passive component over and between the first integrated circuit die and the second integrated circuit die.

20 Claims, 4 Drawing Sheets ized the present invention.

INTEGRATED CIRCUIT PACKAGING SYSTEM WITH PASSIVE COMPONENTS

TECHNICAL FIELD

The present invention relates generally to integrated circuit packaging, and more particularly to a system for embedding discrete passive components in a multi-chip integrated circuit package.

BACKGROUND ART

There are strong needs for downsizing, weight reduction and functional upgrading in the recent fields of mobile devices, such as cellular telephones, personal audio players, hand held navigation devices, and information/home appliances, which eventually demands functional upgrading of LSI (large-scale integrated circuit). Thus there is an accelerated trend of fabricating circuits using a plurality of different processes on a single wafer, which is known as SOC (system-on-chip). SOC, however, requires a longer and more complicated process as compared with a single process, and thus has general tendencies of lower yield ratio and longer development period. SOC is also disadvantageous in that the individual circuits cannot be fabricated according to respective optimum processes since all processes are carried out on the wafer basis, which may yield poorer functions ones rather than those obtained in the single process.

In recent years, interest has been growing in the area of a system-in-package (SIP). The SIP enables the same kind of or different kinds of LSI or IC, to be fabricated by the conventional single process. The individual IC's may be inspected as non-defective and assembled into a unit or module which can be handled as a single component (LSI or IC) by combining and re-wiring. SIP can thus readily realize an LSI unit or IC package having a high yield ratio and diversified functions.

A common requirement of all SIP devices is the incorporation of discrete passive devices with the multiple integrated circuits that make-up the system. In some cases resistors might be used for level translation between two different semiconductor technologies that must be combined in the same package. The power systems of all SIP devices need capacitors or inductors for conditioning and isolating the power source. These devices are normally mounted on a substrate that provides a conductive path that terminates adjacent to the destination IC. A bonding wire is normally used to complete the connection path.

Many of today's high speed devices require tight impedance control on the interconnection path. This presents a serious problem to the signal quality of the normal interconnect solution. As the number of high speed interconnections increases, the integrated circuit dice are pushed closer together in order to reduce the effects of the conductive path between the dice. These conflicting requirements may cause delay in system delivery in order to reconfigure the dice or increase the size of the package in order to accommodate a large number of interconnect structures adjacent to the dice.

Thus, a need still remains for an integrated circuit packaging system with passive components, that satisfies the signal quality needs without increasing the size of the SIP. In view of the increasing demand for more function packaged in smaller spaces, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system comprising: fabricating a system-in-package substrate; mounting a first integrated circuit die on the system-in-package substrate; mounting a second integrated circuit die on the system-in-package substrate; and coupling a passive component over and between the first integrated circuit die and the second integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
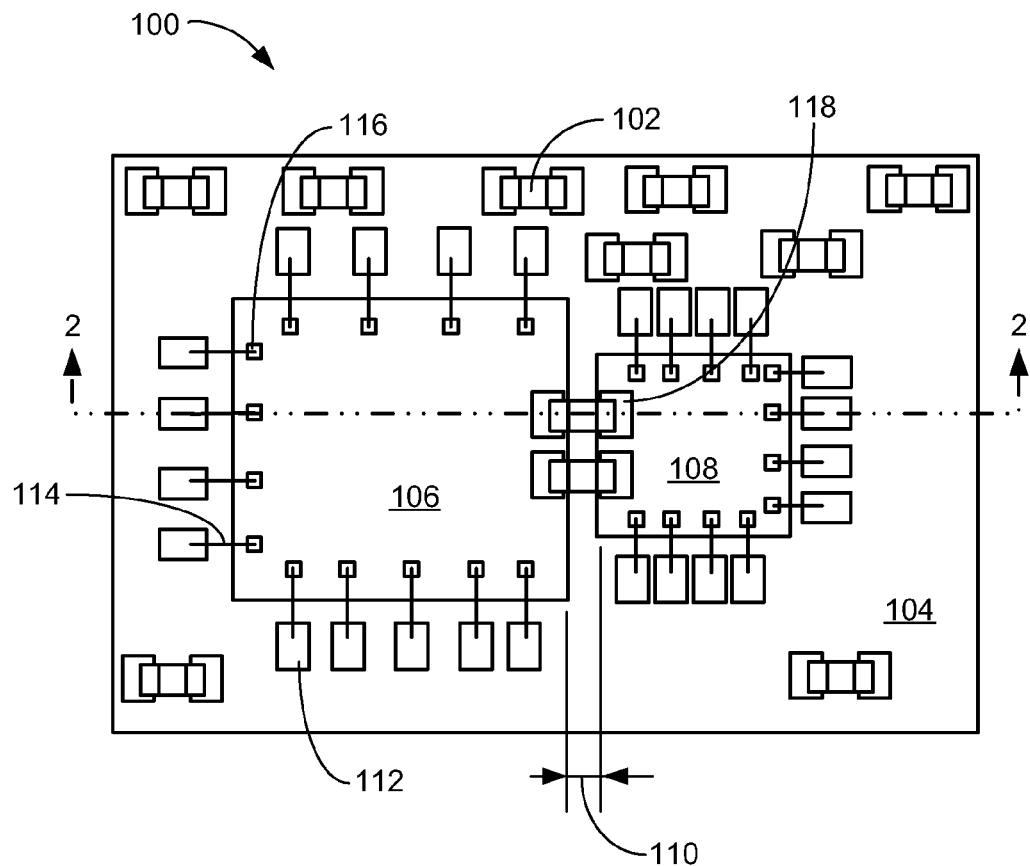
FIG. 1 is a top view of an integrated circuit packaging system with passive components, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the system-in-package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a top view of an integrated circuit packaging system 100 with passive components 102, in an embodiment of the present invention. The top view of the integrated circuit packaging system 100 depicts a system-in-package substrate 104, such as a substrate that supports more than a first integrated circuit die 106 as well as the passive components 102. A second integrated circuit die 108 is positioned as closely as possible to the first integrated circuit die 106. A minimum space 110, such as 0.375 mm, must be maintained between the first integrated circuit die 106 and the second integrated circuit die 108. The minimum space 110 is an example of the current manufacturing capability at the time of writing this application, but the minimum space 110 may be reduced or eliminated in the future.

Contact pads 112 may be aligned adjacent to the first integrated circuit die 106, the second integrated circuit die 108, or may be distributed on the system-in-package substrate 104 for connection of the passive components 102. The passive components 102, such as resistors, capacitors, inductors, diodes, or the like, may support the interface between the first integrated circuit die 106 and the second integrated circuit die 108. The passive components 102 may also provide power conditioning for the first integrated circuit die 106 and the second integrated circuit die 108. Electrical interconnects 114, such as bond wires, may provide a conductive path between the contact pads 112, the first integrated circuit die 106, the second integrated circuit die 108, or a combination thereof.

Interface pads 116, such as bonding pads, may be formed around the edges of the first integrated circuit die 106 and the second integrated circuit die 108. An on-die contact 118, such as a solder paste or a conductive epoxy, may be dispensed over some of the interface pads 116, for mounting the passive components 102 between the first integrated circuit die 106 and the second integrated circuit die 108 by mounting them directly on the on-die contact 118. This configuration may simplify the design of the system-in-package substrate 104 by removing some of the interconnect requirements while improving the signal quality between the first integrated circuit die 106 and the second integrated circuit die 108. A smaller package size is possible because of the reduction in the number of interconnect paths on the system-in-package substrate 104.

The embodiment described in FIG. 1 is an example only. The figure shows two of the passive components 102 mounted over and between the first integrated circuit die 106 and the second integrated circuit die 108. It is understood that a different number of the passive components 102 may be mounted over and between the dice. It is further understood that more than two of the integrated circuit die may be mounted on the system-in-package substrate 104 and may be coupled by the previously described invention.

Figure 2:
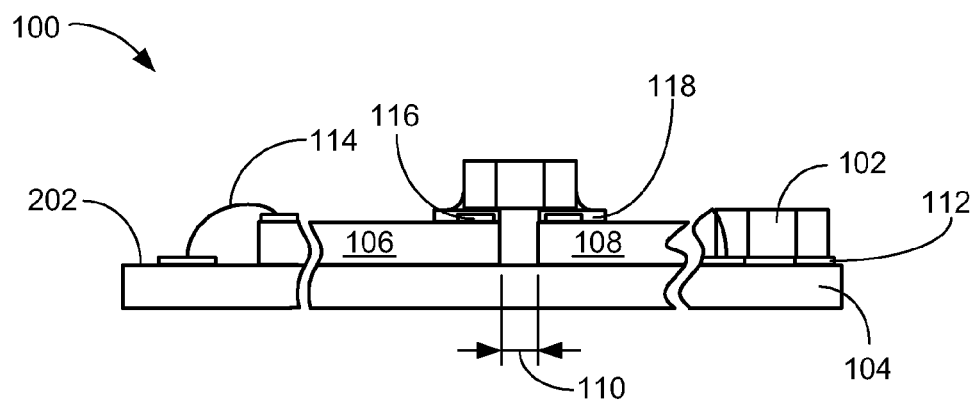
FIG. 2 is a cross-sectional view of the integrated circuit packaging system along the section line 2-2, of FIG. 1.

Referring now to FIG. 2, therein is shown a cross-sectional view of the integrated circuit packaging system 100 along the section line 2-2, of FIG. 1. The cross-sectional view of the integrated circuit packaging system 100 depicts the system-in-package substrate 104 having the contact pads 112, the first integrated circuit die 106 and the second integrated circuit die 108 on a top surface 202. The electrical interconnects 114 couple the contact pads 112 to the interface pads 116 on the first integrated circuit die 106 and the second integrated circuit die 108. The minimum space 110 separates the first integrated circuit die 106 and the second integrated circuit die 108.

One of the passive components 102 is mounted on the contact pads 112. The interface between the first integrated circuit die 106 and the second integrated circuit die 108 is coupled through the passive component 102 mounted on the on-die contact 118. The on-die contact 118 is dispensed on the interface pad 116 for providing an electrical connection between the passive component 102 and the interface pad 116.

Figure 3:
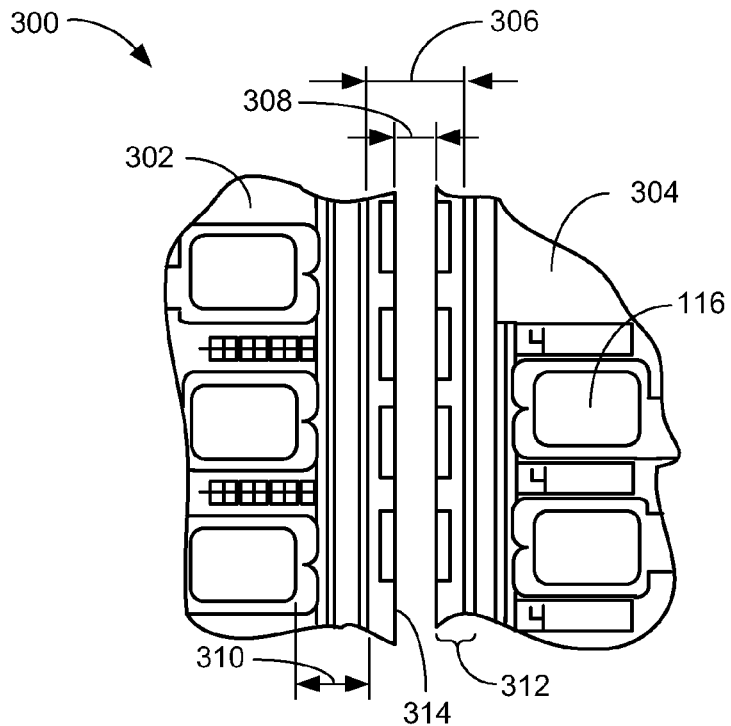
FIG. 3 is a magnified view of an interface pad geometry between two dice on a wafer.

Referring now to FIG. 3, therein is shown a magnified view of an interface pad geometry 300 between two dice on a wafer. The magnified view of the interface pad geometry 300 depicts a first die 302 and a second die 304 separated by a saw street 306, such as a metalized region for controlling cracks during singulation. A kerf width 308 represents the opening created by a singulation saw during the singulation process. A pad saw-line space 310 may be less than 50 μm. This limitation of the current semiconductor technology may be reduced in future versions of semiconductor technologies.

After singulation, a remaining saw street 312 may be 25 μm. An edge of the interface pad 116 may be less than 75 μm from a singulated edge 314 of the first die 302.

Figure 4:
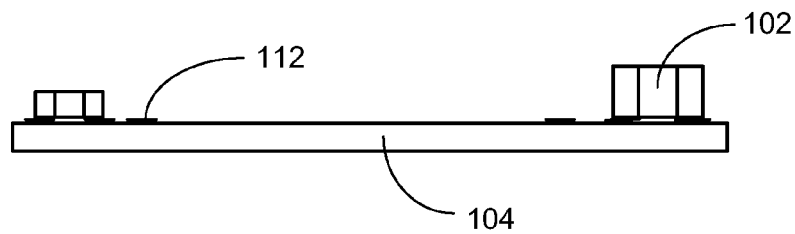
FIG. 4 is a cross-sectional view of a system-in-package assembly in a passive mounting phase of manufacturing.

Referring now to FIG. 4, therein is shown a cross-sectional view of a system-in-package assembly 400 in a passive mounting phase of manufacturing. The cross-sectional view of the system-in-package assembly 400 depicts the system-in-package substrate 104 having the contact pads 112 for connecting the passive components 102 and further connections for future assembly.

Figure 5:
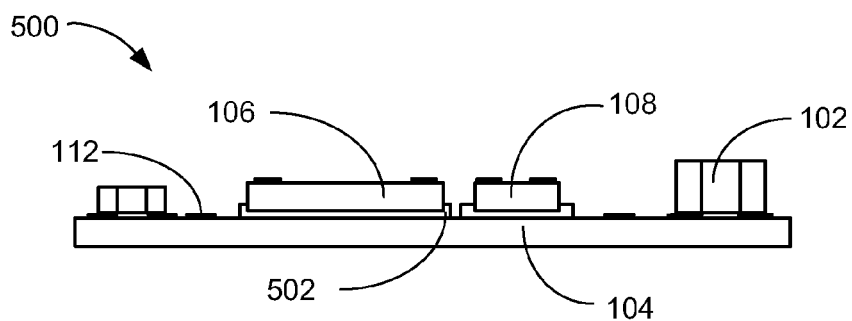
FIG. 5 is a cross-sectional view of a system-in-package assembly in a die attach phase of manufacturing.

Referring now to FIG. 5, therein is shown a cross-sectional view of a system-in-package assembly 500 in a die attach phase of manufacturing. The cross-sectional view of the system-in-package assembly 500 depicts the system-in-package substrate 104 having the contact pads 112 for connecting the passive components 102 and further connections for future assembly. An adhesive 502, such as a die attach material, is applied on the system-in-package substrate 104 for mounting the first integrated circuit die 106 and the second integrated circuit die 108.

Figure 6:
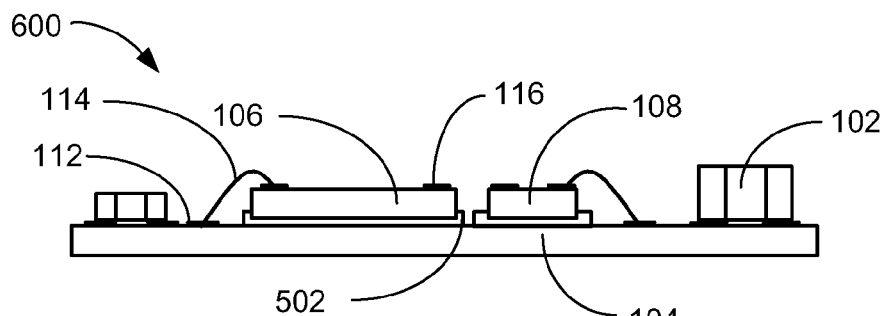
FIG. 6 is a cross-sectional view of a system-in-package assembly in an electrical interconnect phase of manufacturing.

Referring now to FIG. 6, therein is shown a cross-sectional view of a system-in-package assembly 600 in an electrical interconnect phase of manufacturing. The cross-sectional view of the system-in-package assembly 600 depicts the system-in-package substrate 104 having the contact pads 112 for connecting the passive components 102 and further connections for future assembly. The adhesive 502, such as a die attach material, is applied on the system-in-package substrate 104 for mounting the first integrated circuit die 106 and the second integrated circuit die 108. The electrical interconnects 114 couple the contact pads 112 to the interconnect pads 116 on the first integrated circuit die 106 and the second integrated circuit die 108.

Figure 7:
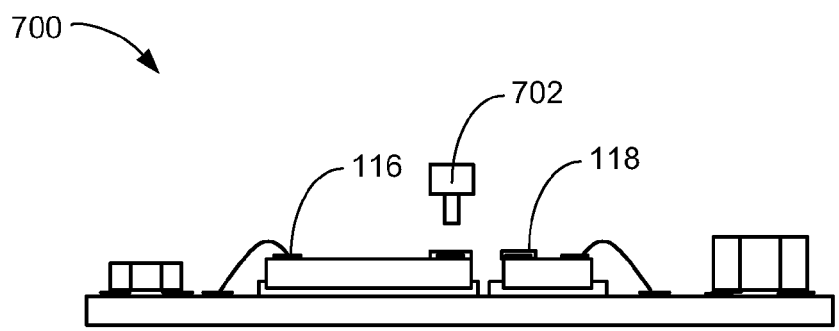
FIG. 7 is a cross-sectional view of a system-in-package assembly in a conductive material dispensing phase of manufacturing.

Referring now to FIG. 7, therein is shown a cross-sectional view of a system-in-package assembly 700 in a conductive material dispensing phase of manufacturing. The cross-sectional view of the system-in-package assembly 700 depicts a dispensing unit 702 for dispensing the on-die contact 118, such as solder paste or a conductive epoxy, on some of the interconnect pads 116.

Figure 8:
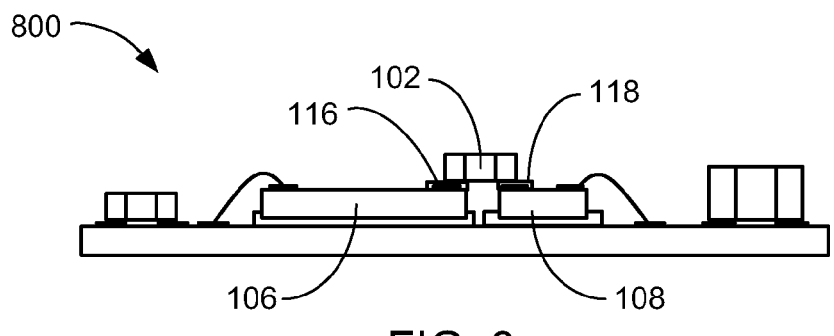
FIG. 8 is a cross-sectional view of a system-in-package assembly in a passive component mounting phase of manufacturing.

Referring now to FIG. 8, therein is shown a cross-sectional view of a system-in-package assembly 800 in a passive component mounting phase of manufacturing. The cross-sectional view of the system-in-package assembly 800 depicts the passive component 102 mounted over and between the first integrated circuit die 106 and the second integrated circuit die 108. The on-die contact 118 is on the interface contact 116 to provide a larger mounting area for the passive component 102.

Figure 9:
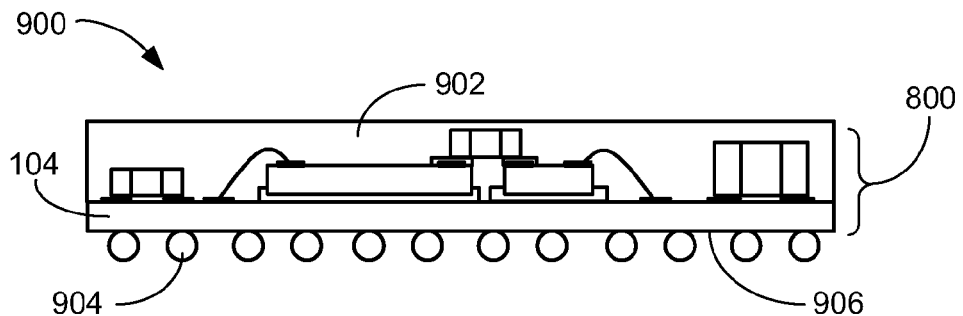
FIG. 9 is a cross-sectional view of a system-in-package device in an embodiment of the present invention.

Referring now to FIG. 9, therein is shown a cross-sectional view of a system-in-package device 900 in an embodiment of the present invention. The cross-sectional view of the system-in-package device 900 depicts an encapsulant 902, such as an epoxy molding compound, over the system-in-package assembly 800, of FIG. 8. System contacts 904 are coupled to a bottom side 906 of the system-in-package substrate 104, for providing a conductive path to the next level system (not shown).

Figure 10:
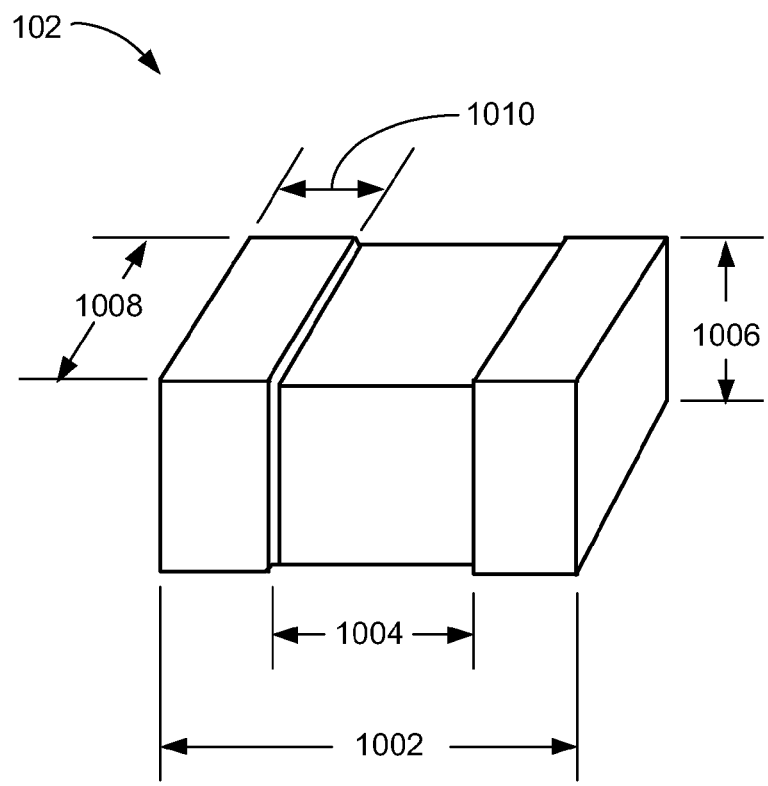
FIG. 10 is a perspective view of a passive component in a standard package size.

Referring now to FIG. 10, therein is shown a perspective view of the passive component 102 in a standard package size. The perspective view of the passive component 102 depicts a component length 1002, an insulation length 1004, a component thickness 1006, a component width 1008, and a conductive end cap length 1010. The sizes in millimeters for different package groups are shown in table 1 below:

TABLE 1

| Package Group dimensions in mm | | | | | |
| --- | --- | --- | --- | --- | --- |
| Package Group | 1002 | 1004 | 1006 | 1008 | 1010 |
| 603 | 0.6 | 0.3 | 0.23 | 0.3 | 0.15 |
| 1005 | 1 | 0.6 | 0.35 | 0.5 | 0.2 |
| 1608 | 1.6 | 0.9 | 0.86 | 0.81 | 0.35 |
| 2012 | 2 | 1 | 0.94 | 1.4 | 0.5 |

The current manufacturing guidelines require a die to die spacing of 0.375 mm and the interface contact 116, of FIG. 1, may be 0.075 mm from the singulated edge 314. Thus a minimum contact pad to contact pad spacing is 0.525 mm. This measurement provides sufficient connection margin for all of the Package Groups, except the 603 package group. Some accommodation may be made to allow the use of the 603 package group, but in the current manufacturing processes, this would be considered special handling. All other of the Package Groups are acceptable for volume production.

Figure 11:
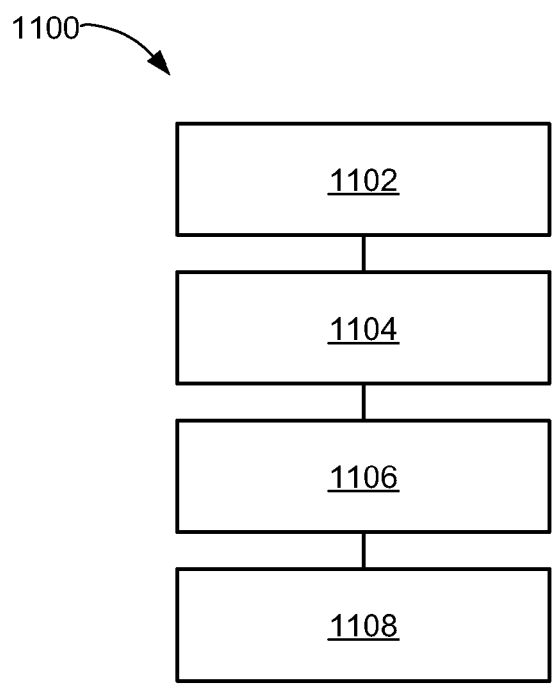
FIG. 11 is a flow chart of an integrated circuit packaging system for manufacturing the integrated circuit packaging system with passive components, in an embodiment of the present invention.

Referring now to FIG. 11, therein is shown a flow chart of an integrated circuit packaging system 1100 for manufacturing the integrated circuit packaging system 100 with passive components in an embodiment of the present invention. The system 1100 includes fabricating a system-in-package substrate in a block 1102; mounting a first integrated circuit die on the system-in-package substrate in a block 1104; mounting a second integrated circuit die on the system-in-package substrate in a block 1106; and coupling a passive component over and between the first integrated circuit die and the second integrated circuit die in a block 1108.

It has been discovered that the present invention thus has numerous aspects.

A principle aspect of the present invention is that mounting the passive components over and between the dice provides the best possible signal quality for the interface.

Another aspect is by removing the routing traces and contact pads from the system-in-package substrate, the system-in-package substrate may become smaller. This supports one of the most stringent requirements of the hand held electronics market.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system with passive components, of the present invention furnishes important and heretofore unknown and unavailable solutions, capabilities, and functional aspects for manufacturing smaller system-in-package devices. The resulting processes and configurations are straightforward, cost-effective, uncomplicated, highly versatile and effective, can be surprisingly and unobviously implemented by adapting known technologies, and are thus readily suited for efficiently and economically manufacturing system-in package devices that are fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
   fabricating a system-in-package substrate;
   connecting a first passive component on the system-in-package substrate;
   mounting a first integrated circuit die, adjacent to the first passive component, on the system-in-package substrate;
   mounting a second integrated circuit die on the system-in-package substrate; and
   coupling a passive component over and between the first integrated circuit die and the second integrated circuit die.

2. The method as claimed in claim 1 further comprising dispensing an on-die contact on the first integrated circuit die and the second integrated circuit die.

3. The method as claimed in claim 1 wherein coupling the passive component includes attaching a resistor, a capacitor, an inductor, or a diode over and between the first integrated circuit die and the second integrated circuit die.

4. The method as claimed in claim 1 further comprising molding an encapsulant on the system-in-package substrate, the first integrated circuit die, the second integrated circuit die, the passive component, electrical interconnects, contact pads, and an on-die contact.

5. The method as claimed in claim 1 wherein mounting the second integrated circuit die on the system-in-package substrate includes maintaining a minimum space between the first integrated circuit die and the second integrated circuit die.

6. A method of manufacturing an integrated circuit packaging system comprising:
fabricating a system-in-package substrate having contact pads;
connecting a first passive component on the contact pads;
mounting a first integrated circuit die, adjacent to the first passive component, on the system-in-package substrate including applying an adhesive on the system-in-package substrate;
mounting a second integrated circuit die on the system-in-package substrate; and
coupling a passive component over and between the first integrated circuit die and the second integrated circuit die.

7. The method as claimed in claim 6 further comprising dispensing an on-die contact on the first integrated circuit die and the second integrated circuit die including dispensing a solder paste or a conductive epoxy on an interface pad.

8. The method as claimed in claim 6 wherein coupling the passive component includes attaching a resistor, a capacitor, an inductor, or a diode over and between the first integrated circuit die and the second integrated circuit die for forming an electrical interface between the first integrated circuit die and the second integrated circuit die.

9. The method as claimed in claim 6 further comprising molding an encapsulant on the system-in-package substrate, the first integrated circuit die, the second integrated circuit die, the passive components, electrical interconnects, the contact pads, and an on-die contact for forming a system-in-package device.

10. The method as claimed in claim 6 wherein mounting the second integrated circuit die on the system-in-package substrate includes maintaining a minimum space between the first integrated circuit die and the second integrated circuit die including electrically connecting the passive component between the first integrated circuit die and the second integrated circuit die.

11. An integrated circuit packaging system comprising:
a system-in-package substrate;
a first passive component on the system-in-package substrate;
a first integrated circuit die mounted on the system-in-package substrate adjacent to the first passive component;
a second integrated circuit die mounted on the system-in-package substrate; and
a passive component coupled over and between the first integrated circuit die and the second integrated circuit die.

12. The system as claimed in claim 11 further comprising an on-die contact on the first integrated circuit die and the second integrated circuit die.

13. The system as claimed in claim 11 wherein the passive component coupled includes a resistor, a capacitor, an inductor, or a diode attached over and between the first integrated circuit die and the second integrated circuit die.

14. The system as claimed in claim 11 further comprising an encapsulant molded on the system-in-package substrate, the first integrated circuit die, the second integrated circuit die, the passive components, electrical interconnects, contact pads, and an on-die contact.

15. The system as claimed in claim 11 wherein the second integrated circuit die mounted on the system-in-package substrate includes a minimum space between the first integrated circuit die and the second integrated circuit die.

16. The system as claimed in claim 11 further comprising:
contact pads on the system-in-package substrate; and
an adhesive on the system-in-package substrate.

17. The system as claimed in claim 16 further comprising an on-die contact on the first integrated circuit die and the second integrated circuit die including a solder paste or a conductive epoxy dispensed on an interface pad.

18. The system as claimed in claim 16 wherein the passive component coupled includes a resistor, a capacitor, an inductor, or a diode attached over and between the first integrated circuit die and the second integrated circuit die for forming an electrical interface between the first integrated circuit die and the second integrated circuit die.

19. The system as claimed in claim 16 further comprising a system-in-package device formed by an encapsulant molded on the system-in-package substrate, the first integrated circuit die, the second integrated circuit die, the passive components, electrical interconnects, the contact pads, and an on-die contact.

20. The system as claimed in claim 16 wherein the second integrated circuit die mounted on the system-in-package substrate includes a minimum space between the first integrated circuit die and the second integrated circuit die includes the passive component electrically connected between the first integrated circuit die and the second integrated circuit die.

* * * * *